United States Patent
Xue et al.

(10) Patent No.: US 11,751,385 B2
(45) Date of Patent: Sep. 5, 2023

(54) THREE-DIMENSIONAL MEMORY DEVICES AND FABRICATING METHODS THEREOF

(71) Applicant: Yangtze Memory Technologies Co., Ltd., Hubei (CN)

(72) Inventors: Jiaqian Xue, Hubei (CN); Tingting Gao, Hubei (CN); Lei Xue, Hubei (CN); Wanbo Geng, Hubei (CN); Xiaoxin Liu, Hubei (CN); Bo Huang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 161 days.

(21) Appl. No.: 17/005,612

(22) Filed: Aug. 28, 2020

(65) Prior Publication Data

US 2021/0296336 A1    Sep. 23, 2021

Related U.S. Application Data

(63) Continuation of application No. PCT/CN2020/079572, filed on Mar. 17, 2020.

(51) Int. Cl.
*H01L 27/11582* (2017.01)
*H10B 41/27* (2023.01)
(Continued)

(52) U.S. Cl.
CPC ............ *H10B 41/27* (2023.02); *H10B 41/35* (2023.02); *H10B 43/27* (2023.02); *H10B 43/35* (2023.02)

(58) Field of Classification Search
CPC ................ H01L 27/11578; H01L 27/11582
See application file for complete search history.

(56) References Cited

U.S. PATENT DOCUMENTS 9,627,405 B1   4/2017  Lee
10,854,621 B2  12/2020 Hua et al.
(Continued)

FOREIGN PATENT DOCUMENTS

CN    103872055 A    6/2014
CN    105374825 A    3/2016
(Continued)

OTHER PUBLICATIONS

International Search Report of the International Searching Authority directed to related International Patent Application No. PCT/CN2020/079572, dated Nov. 13, 2020; 4 pages.

*Primary Examiner* — Christopher A Johnson
(74) *Attorney, Agent, or Firm* — Sterne, Kessler, Goldstein & Fox P.L.L.C.

(57) ABSTRACT

A method for forming a 3D memory device is provided. The method comprises forming a sacrificial layer on a substrate, forming an alternating dielectric stack on the sacrificial layer, forming a plurality of channel holes vertically penetrating the alternating dielectric stack and the sacrificial layer, and forming a first channel layer in each channel hole. The method further comprises forming a second channel layer on the first channel layer in each channel hole, such that a merging point of the second channel layer is higher than a bottom surface of the alternating dielectric stack. The method further comprises removing the sacrificial layer to form a horizontal trench, and forming a selective epitaxial growth layer in the horizontal trench.

20 Claims, 9 Drawing Sheets

(51) Int. Cl.
*H10B 41/35* (2023.01)
*H10B 43/27* (2023.01)
*H10B 43/35* (2023.01)

(56) References Cited

U.S. PATENT DOCUMENTS

| | | |
|---|---|---|
| 2012/0021574 A1 | 1/2012 | Lee et al. |
| 2016/0079272 A1* | 3/2016 | Lee ........................ H01L 21/223 438/269 |
| 2019/0181226 A1* | 6/2019 | Choi ................. H01L 29/42368 |
| 2020/0286903 A1* | 9/2020 | Cui .................. H01L 29/40114 |
| 2021/0098488 A1 | 4/2021 | Zhu |
| 2022/0123018 A1* | 4/2022 | Surthi ............... H01L 27/11556 |

FOREIGN PATENT DOCUMENTS

| | | |
|---|---|---|
| CN | 107293544 A | 10/2017 |
| CN | 109997226 A | 7/2019 |
| CN | 110010613 A | 7/2019 |
| CN | 110140211 A | 9/2019 |
| CN | 110600422 A | 12/2019 |
| CN | 110676258 A | 1/2020 |
| CN | 110752214 A | 2/2020 |
| CN | 110767655 A | 2/2020 |
| CN | 110785846 A | 2/2020 |
| WO | WO 2019/0921200 A1 | 5/2019 |

\* cited by examiner

THREE-DIMENSIONAL MEMORY DEVICES AND FABRICATING METHODS THEREOF

CROSS-REFERENCE TO RELATED APPLICATIONS

This application claims priority to PCT Application No. PCT/CN2020/079572, filed on Mar. 17, 2020, which is incorporated herein by reference in its entirety.

TECHNICAL FIELD

The present disclosure generally relates to the field of semiconductor technology, and more particularly, to a method for forming a three-dimensional (3D) memory device.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of method for forming gate structures of 3D memory devices and fabrication methods thereof are disclosed herein.

Disclosed is a method for forming a three-dimensional (3D) NAND memory device. The method comprises forming a sacrificial layer on a substrate, forming an alternating dielectric stack on the sacrificial layer, forming a plurality of channel holes vertically penetrating the alternating dielectric stack and the sacrificial layer, and forming a first channel layer in each channel hole. The method further comprises forming a second channel layer on the first channel layer in each channel hole, such that a merging point of the second channel layer is higher than a bottom surface of the alternating dielectric stack. The method further comprises removing the sacrificial layer to form a horizontal trench, and forming a selective epitaxial growth layer in the horizontal trench.

In some embodiments, the method further comprises, before forming the sacrificial layer, performing an implantation process to an upper surface of the substrate to form a doped upper substrate.

In some embodiments, forming the sacrificial layer comprises forming a monocrystalline silicon film sandwiched between two protect films.

In some embodiments, forming the alternating dielectric stack comprises forming at least 64 dielectric layer pairs each comprising a first dielectric layer and a second dielectric layer different from the first dielectric layer.

In some embodiments, the method further comprises, before forming the first channel layer, forming a functional layer including a barrier layer, a storage layer and a tunneling layer on a sidewall of each channel hole; and after removing the sacrificial layer, removing a portion of the functional layer that is exposed by the horizontal trench.

In some embodiments, forming the forming the first channel layer comprises: forming the first channel layer to cover the functional layer in each channel hole; performing a cleaning process to clean the multiple channel holes; and performing an implantation process to treat an exposed surface of the first channel layer on the bottom of each channel hole to form a doped channel layer.

In some embodiments, forming the second channel layer comprises forming the second channel layer in each channel hole to cover the sidewall of the channel hole and a top surface of the doped channel layer.

In some embodiments, the method further comprises, before removing the sacrificial layer, forming a gate line slit penetrating the alternating dielectric stack to expose the sacrificial layer.

In some embodiments, forming the selective epitaxial growth layer comprises forming an "L" shaped selective epitaxial growth layer in the horizontal trench, wherein a vertical surface of the selective epitaxial growth layer is in contact with the first channel layer or the second channel layer, and a horizontal surface of the selective epitaxial growth layer is in contact with the doped upper substrate.

In some embodiments, forming the selective epitaxial growth layer further comprises oxidizing an exposed surface of the selective epitaxial growth layer, and performing an annealing process to diffuse ions from the doped upper substrate and the doped channel layer to an un-oxidized portion of the selective epitaxial growth layer.

Another aspect of the present disclosure provides a three-dimensional (3D) NAND memory device, comprising: a selective epitaxial growth layer on a substrate; an alternating dielectric/conductive stack on the selective epitaxial growth layer, the alternating dielectric/conductive stack including a plurality of dielectric/conductive layer pairs on a substrate, each of the plurality of dielectric/conductive layer pairs comprising a dielectric layer and a conductive layer; a plurality of channel holes vertically penetrating the alternating dielectric stack and the sacrificial layer; and an enhanced channel layer including at least two sub channel layers in each channel hole, wherein a merging point of the enhanced channel layer is higher than a bottom surface of the alternating dielectric/conductive stack.

In some embodiments, the substrate includes a doped upper substrate; and the selective epitaxial growth layer is located on the doped upper substrate.

In some embodiments, the device further comprises a horizontal trench between the selective epitaxial growth layer and the alternating dielectric/conductive stack.

In some embodiments, a surface of the selective epitaxial growth layer exposed by the horizontal trench is oxidized.

In some embodiments, the selective epitaxial growth layer has an "L" shape, wherein a vertical surface of the selective epitaxial growth layer is in contact with the enhanced channel layer, and a horizontal surface of the selective epitaxial growth layer is in contact with the doped upper substrate.

In some embodiments, the alternating dielectric/conductive stack comprises at least 64 dielectric layer pairs each comprising a dielectric layer and a conductive layer.

In some embodiments, the device further comprises a functional layer including a barrier layer, a storage layer and a tunneling layer on a sidewall of each channel hole and covered by the enhanced channel layer; and at least one gate line slit vertically penetrating the alternating dielectric/conductive stack and horizontally extending between the plurality of channel holes.

In some embodiments, a first thickness of the enhanced channel layer at a portion in contact with the selective epitaxial growth layer is at least twice of a second thickness of the enhanced channel layer at a portion on the sidewall of the channel holes.

In some embodiments, an inner portion of the enhanced channel layer is doped with Boron ions.

In some embodiments, an un-oxidized portion of the selective epitaxial growth layer includes Boron ions diffused from the inner portion of the enhanced channel layer and the doped upper substrate.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
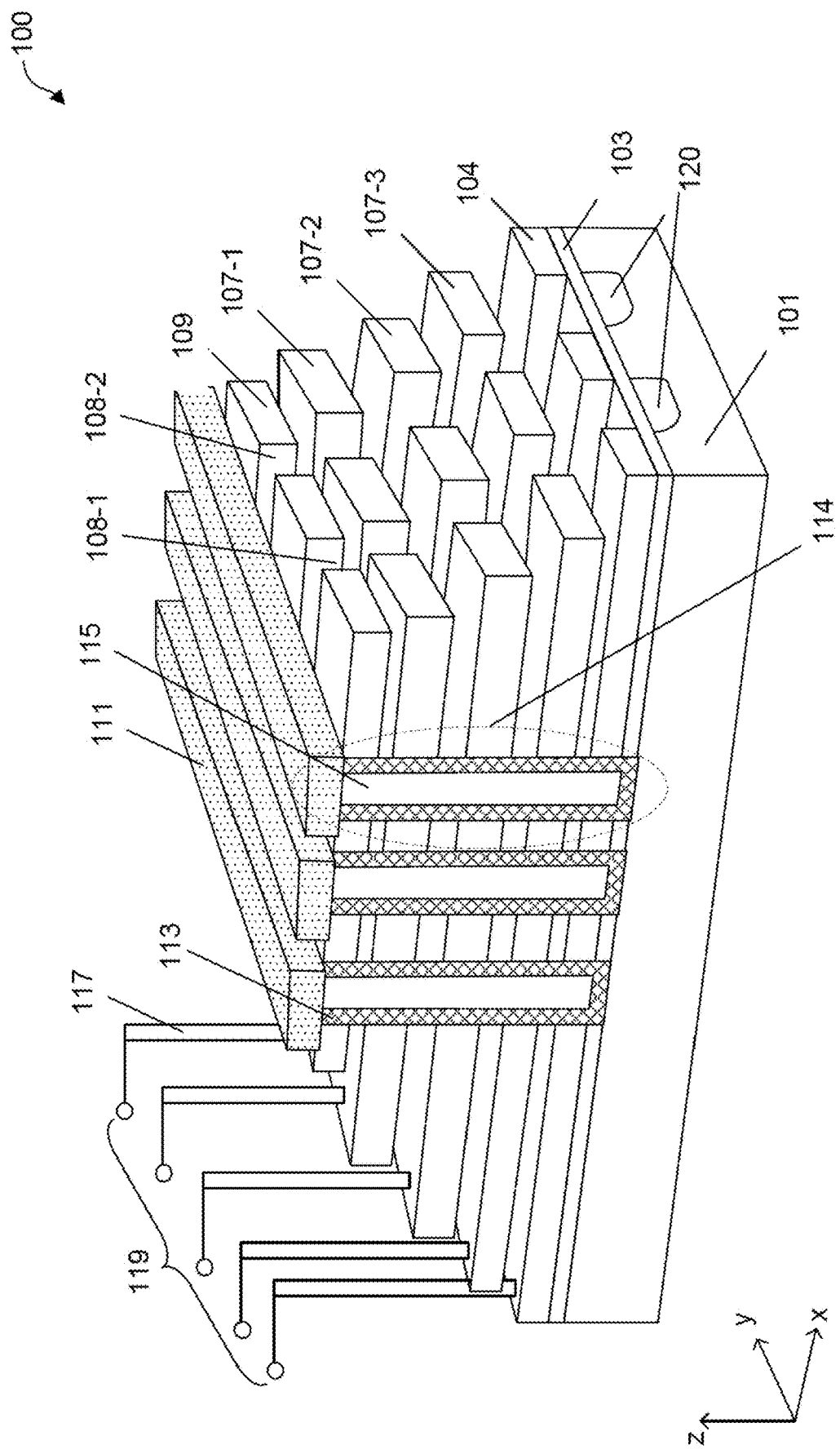
FIG. 1 illustrates a schematic diagram of an exemplary 3D NAND memory device, in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Lithography and etching processes can be used to open contact areas for forming electrical connection in semiconductor structures, such as openings for forming contacts for word lines, peripheral devices, or substrate contacts. For example, in a 3D NAND memory device, electrical connections such as word line contacts are formed by disposing conductive material in openings and connected to the conductive layer on each level of the staircase structure. Electrical connections are also formed to connect peripheral circuitry to other device/structures. Other layers and structures such as metal layers and vias are formed on the staircase structure and peripheral circuitry. Exemplary vias can include via 0 connecting the electrical contacts to the M0 metal lines. M0 metal lines can be a local interconnect that represents a first interconnect level and electrically connects to an underlying semiconductor device through a via. Other metal lines can be formed in the metal layers.

Lithography processes for forming vias in 3D NAND memory devices include using a lithographic apparatus, which is a machine that applies a desired pattern onto a substrate, usually onto a target portion of the substrate. For example, lithographic apparatus can include a patterning device, which is alternatively referred to as a mask or a reticle, used to generate a circuit pattern to be formed on an individual layer of the integrated circuit. This pattern can be aligned to a target portion (e.g., staircase structure or peripheral circuitry) on a substrate (e.g., a 3D NAND memory device) and transferred onto the target portion. Transfer of the pattern is typically performed by imaging a pattern onto a layer of radiation-sensitive material (photoresist) provided on the substrate.

As the demand for higher storage capacity continues to increase, the number of vertical levels of the memory cells and staircase structures also increases. For example, a 64-level 3D NAND memory device can include two 32-level staircase structures with one formed on top of the other. Similarly, a 128-level 3D NAND memory device can include two 64-level staircase structures. As device critical dimensions continue to shrink, it is increasingly more challenging to etch openings for forming channel structures. Using a 128-level 3D NAND memory device as an example, the channel structures require openings that have large depths and high aspect ratio to be formed. The formation of openings with higher aspect ratio can cause over etch in openings with lower aspect ratio, which in turn can lead to device failure. Accordingly, it is challenging to balance the manufacturing throughput and the process complexity/cost.

To avoid deep channel hole etch and the following bottom select gate (BSG) layer selective epitaxial growth (SEG), a side wall SEG (SWS) method is developed. However, in the existing SWS method, the merging point of the channel layer in the channel structure is near to the top of a sacrificial polysilicon layer in the substrate, which can result in a risk of breaking post SEG oxidation. In addition, an undoped L-shape SEG layer formed in the existing SWS method can cause a less controllable of the formed BSG electrodes.

To address the above shortcomings, embodiments described herein are directed to enhanced channel structures of a 3D NAND memory device and fabricating methods of the same. The exemplary fabrication method includes forming an enhanced channel structure in each channel hole in the 3D NAND memory structure by using a two-step channel layer filling process. The formed enhanced channel structure can have a higher merging point, which can effectively reduce the risk of channel layer broken during post SEG oxidation. Further, the exemplary fabrication method includes modifying Boron doping from one side doping to two sides doping to forming the BSG layer. The formed BSG electrodes can have an improved control ability.

Before describing in detail methods for forming the disclosed 3D NAND memory devices, an exemplary 3D NAND flash memory device is illustrated in FIG. 1. The flash memory device includes a substrate 101, an insulating layer 103 over substrate 101, a tier of bottom select gate (BSG) electrodes 104 over insulating layer 103, and a plurality of tiers of control gate electrodes 107 (e.g., 107-1, 107-2, and 107-3) stacking on top of bottom select gate electrodes 104. Flash memory device 100 also includes a tier of top select gate electrodes 109 over the stack of control gate electrodes 107, doped source line regions 120 in portions of substrate 101 between adjacent bottom select gate electrodes 104, and semiconductor channels 114 through top select gate (TSG) electrodes 109, control gate electrodes 107, BSG electrodes 104, and insulating layer 103. Semiconductor channel 114 (illustrated by a dashed eclipse) includes a memory film 113 over the inner surface of semiconductor channel 114 and a core filling film 115 surrounded by memory film 113 in semiconductor channel 114. The flash memory device 100 further includes a plurality of bit lines 111 disposed on and connected to semiconductor channels 114 over top select gate electrodes 109. A plurality of metal interconnects 119 are connected to the gate electrodes (e.g., 104, 107, and 109) through a plurality of metal contacts 117. During device fabrication, metal interconnects 119 are aligned and connected to metal contacts 117. In some embodiments, metal contacts 117 can be vias formed in insulating layers that are formed between adjacent tiers of gate electrodes. Insulating layers are not shown in FIG. 1 for simplicity. The gate electrodes can also be referred to as the word lines, which include TSG electrodes 109, control gate electrodes 107, and BSG electrodes 104.

In FIG. 1, for illustrative purposes, three tiers of control gate electrodes 107-1, 107-2, and 107-3 are shown together with one tier of TSG electrodes 109 and one tier of BSG electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all TSG electrodes 109, control gate electrodes 107, and BSG electrodes 104). Further, the same number of metal interconnects is formed to connect to each metal contact 117.

For illustrative purposes, similar or same parts in a 3D NAND memory device are labeled using same element numbers. However, element numbers are merely used to distinguish relevant parts in the Detailed Description and do not indicate any similarity or difference in functionalities, compositions, or locations. The structures illustrated in FIGS. 3-12 are each portions of a 3D NAND memory device. Other parts of the memory device are not shown for ease of description. The specific application of the disclosed structure should not be limited by the embodiments of the present disclosure. For illustrative purposes, word lines and gate electrodes are used interchangeably to describe the present disclosure. In various embodiments, the number of layers, the methods to form these layers, and the specific order to form these layers may vary according to different designs and should not be limited by the embodiments of the present disclosure. It should be noted that the "x" and "y" directions illustrated in these figures are for clarity purposes and should not be limiting.

Figure 2:
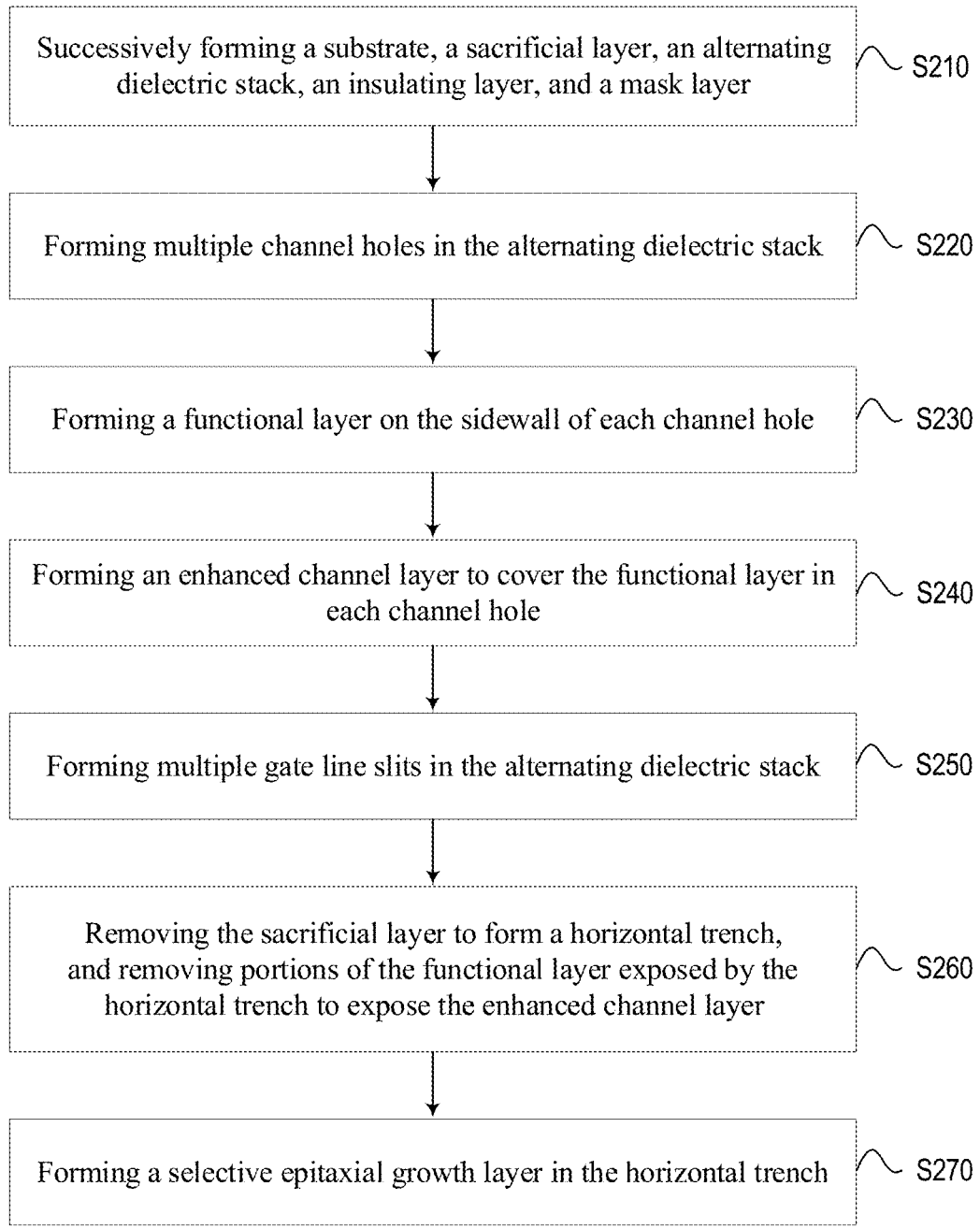
FIG. 2 illustrates a flow diagram of an exemplary method for forming a 3D memory device, according to some embodiments of the present disclosure.

FIG. 2 illustrates a flow diagram of an exemplary method for forming a 3D memory device, according to some embodiments of the present disclosure. FIGS. 3-9 illustrate schematic cross-sectional views of an exemplary 3D memory device at certain fabricating stages of the method shown in FIG. 2 according to some embodiments of the present disclosure.

As shown in FIG. 2, the method starts at operation S210, in which a substrate, a sacrificial layer, an alternating dielectric stack, an insulating layer, and a mask layer can be successively formed.

Figure 3:
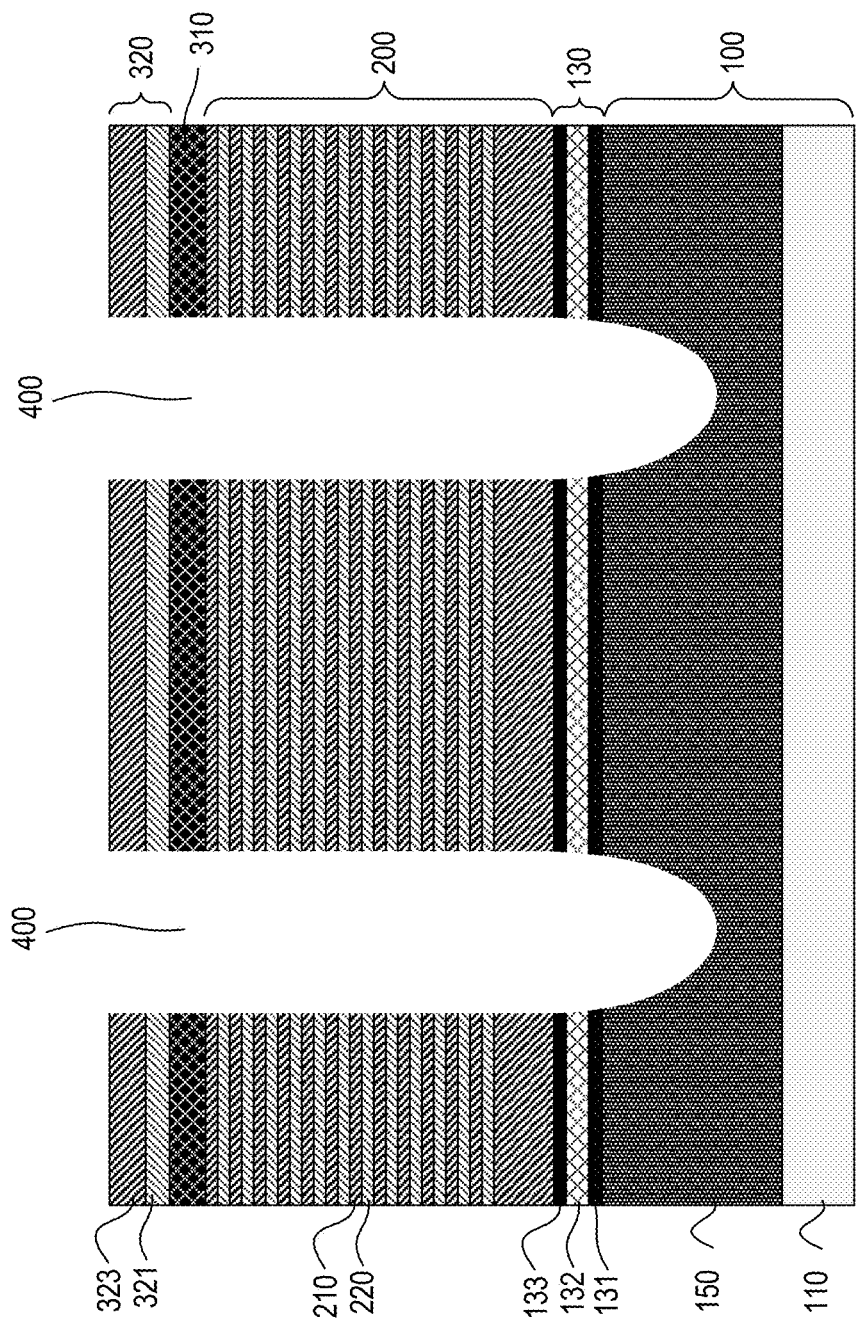
FIGS. 3-9 illustrate schematic cross-sectional views of an exemplary 3D memory device at certain fabricating stages of the method shown in FIG. 2 according to some embodiments of the present disclosure.

As shown in FIG. 3, in some embodiments, the substrate 100 can be any suitable semiconductor substrate having any suitable structure, such as a monocrystalline single-layer substrate, a polycrystalline silicon (polysilicon) single-layer substrate, a polysilicon and metal multi-layer substrate, etc. In some embodiments, an upper portion of the substrate 100 can be doped with p-type dopant, such as Boron ions. In some embodiments, any suitable Boron implantation process can be performed to treat the upper portion of the substrate 100 to form an doped upper substrate 150. The doped upper substrate 150 can be used to form BSG electrodes in the subsequent processes. The remaining portion of the substrate 100 is a polysilicon lower substrate 110.

As shown in FIG. 3, a sacrificial layer 130 can be formed on the doped upper substrate 150. In some embodiments, the sacrificial layer 130 can have a laminated structure, which includes a first protect film 131, a sacrificial silicon film 132, and a second protect film 133. The sacrificial silicon film 132 can be a monocrystalline silicon film sandwiched between the first protect film 131 and the second protect film 133. The first protect film 131 and the second protect film 133 can be made by any suitable insulating material and/or dielectric material, such as silicon oxide. The sacrificial layer 130 can be formed by one or more thin film deposition processes including, but not limited to, Chemical Vapor Deposition (CVD), Physical Vapor Deposition (PVD), Atomic Layer Deposition (ALD), or any combination thereof.

As shown in FIG. 3, an alternating dielectric stack 200 including a plurality of dielectric layer pairs can be formed on the sacrificial layer 130. Each dielectric layer pairs of the alternating dielectric stack 200 can include an alternating stack of a first dielectric layer 210 and a second dielectric layer 220 that is different from first dielectric layer 210. In some embodiments, the first dielectric layers 210 can be used as insulating layers, and the second dielectric layer 220 can be used as sacrificial layers, which are to be removed in the subsequent processes.

The plurality of first dielectric layers 210 and second dielectric layers 220 are extended in a lateral direction that is parallel to a surface of the substrate 100. In some embodiments, there are more layers than the dielectric layer pairs made of different materials and with different thicknesses in the alternating dielectric stack 200. The alternating dielectric stack 200 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the alternating dielectric stack 200 can include a plurality of oxide/nitride layer pairs. Each dielectric layer pair includes a layer of silicon oxide 210 and a layer of silicon nitride 220. The plurality of oxide/nitride layer pairs are also referred to herein as an "alternating oxide/nitride stack." That is, in the alternating dielectric stack 200, multiple oxide layers 210 and multiple nitride layers 220 alternate in a vertical direction. In other words, except a top and a bottom layer of a given alternating oxide/nitride stack, each of the other oxide layers 210 can be sandwiched by two adjacent nitride layers 220, and each of the nitride layers 220 can be sandwiched by two adjacent oxide layers 210.

Oxide layers 210 can each have the same thickness or have different thicknesses. For example, a thickness of each oxide layer can be in a range from about 10 nm to about 150 nm. Similarly, nitride layers 220 can each have the same thickness or have different thicknesses. For example, a thickness of each nitride layer can be in a range from about 10 nm to about 150 nm. In some embodiments, a total thickness of the alternating dielectric stack 200 can be larger than 1000 nm.

It is noted that, in the present disclosure, the oxide layers 210 and/or nitride layers 220 can include any suitable oxide materials and/or nitride materials. For example, the element of the oxide materials and/or nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack 200 can include any suitable number of layers of the oxide layers 210 and the nitride layers 220. In some embodiments, a total number of layers of the oxide layers 210 and the nitride layers 220 in the alternating dielectric stack 200 is equal to or larger than 64, such as equal to 128. That is, a number of oxide/nitride layer pairs can be equal to or larger than 32, such as equal to 64. In some embodiments, alternating oxide/nitride stack includes more oxide layers or more nitride layers with different materials and/or thicknesses than the oxide/nitride layer pair. For example, a bottom layer and a top layer in the alternating dielectric stack 200 can be oxide layers 210.

As shown in FIG. 3, an insulating layer 310 can be formed on the alternating dielectric stack 200. In some embodiments, the insulating layer 310 can be made by any suitable insulating material and/or dielectric material, such as silicon oxide. It is noted that, the material of the insulating layer 310 can be different from the material of the nitride layer in the first alternating dielectric stack 200. The insulating layer 310 can be formed on the top surface of the alternating dielectric stack 200. In some embodiments, a hard mask layer 320 can be formed on the top surface of the insulating layer 310. In some embodiments, the hard mask layer 320 can include a nitride layer 321 on the top surface of the insulating layer 312, and an oxide layer 323 on the top surface of the nitride layer 321. The nitride layer 323 of the hard mask layer 320 can be a silicon nitride layer. In some embodiments, the insulating layer 310 and the hard mask layer 320 can be formed by using one or more thin film deposition processes, including, but not limited to, a chemical vapor deposition (CVD) process, a physical vapor deposition (PVD) process, an atomic layer deposition (ALD) process, and/or any suitable combination thereof.

Referring back to FIG. 2, the method proceeds to operation S220, in which multiple channel holes can be formed. In some embodiments, the formed multiple channel holes can be arranged as an array in a top view of the 3D structure. As shown in FIG. 3, each channel hole 400 can penetrate vertically through the hard mask layer 320, the insulating layer 310, the alternating dielectric stack 200, and the sacrificial layer 130, and can extend into the doped upper substrate 150. Each channel hole 400 can have a high aspect ratio, and can be formed by a patterning process to etch portions of the hard mask layer 320, the insulating layer 310, the alternating dielectric stack 200, the sacrificial layer 130, the doped upper substrate 150. The etching process to form the channel hole 400 can be a wet etching, a dry etching, or a combination thereof. A cleaning process can be subsequently performed to clean the multiple channel holes 400.

Figure 4:
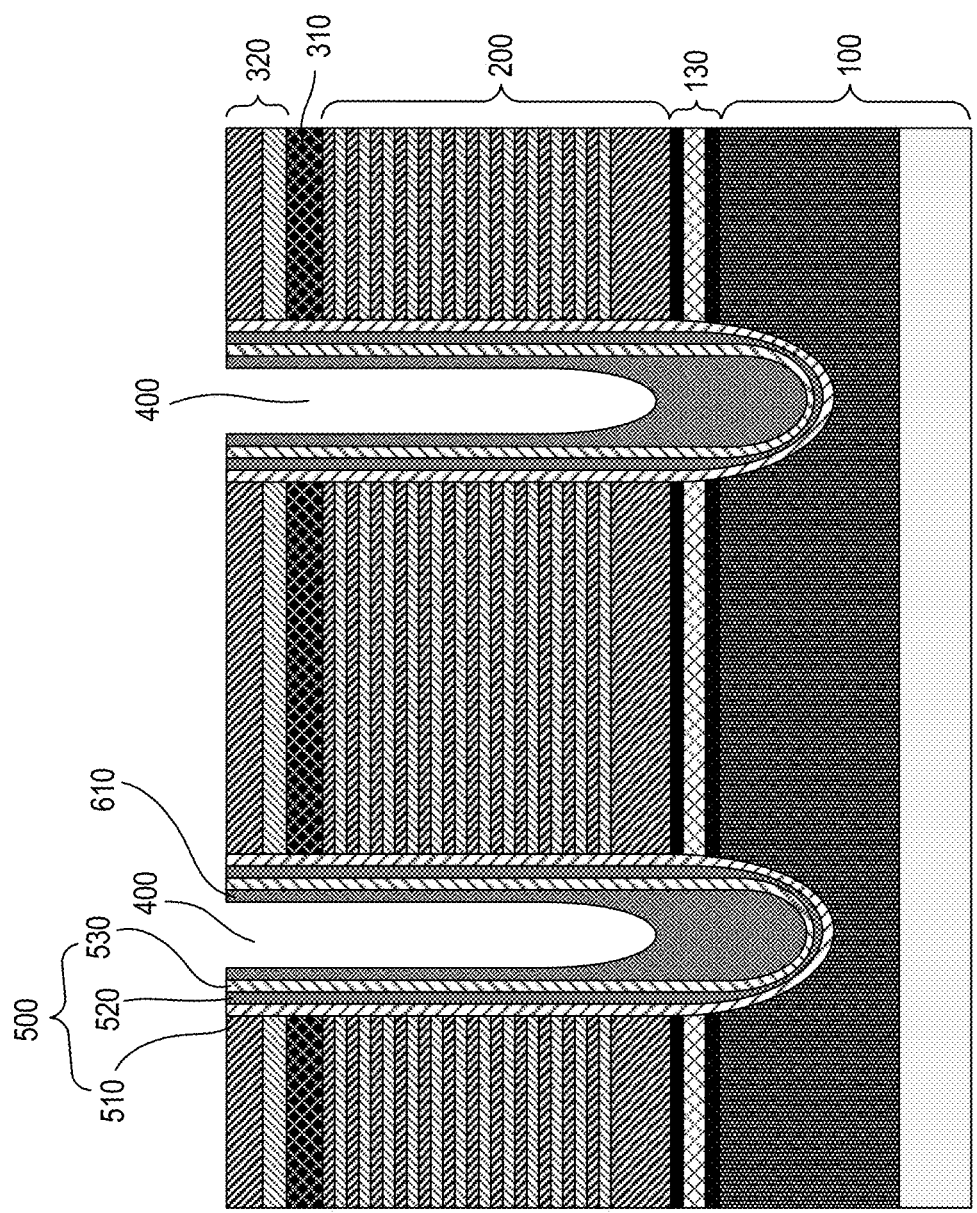

Referring back to FIG. 2, the method proceeds to operation S230, in which a functional layer can be formed on the sidewall of each channel hole. As shown in FIG. 4, the functional layer 500 can be a composite dielectric layer, such as a combination of a barrier layer 510, a storage layer 520, and a tunneling layer 530, and can be formed by one or more thin film deposition processes, such as ALD, CVD, PVD, any other suitable processes, or any combination thereof.

As shown in FIG. 4, the barrier layer 510 can be formed between the storage layer 520 and the sidewall of the channel hole 400. The barrier layer 510 can be used for blocking the outflow of the electronic charges. In some embodiments, the barrier layer 510 can be a silicon oxide layer or a combination of silicon oxide/silicon nitride/silicon oxide (ONO) layers. In some embodiments, the barrier layer 510 includes high dielectric constant (high k-value) dielectrics (e.g., aluminum oxide). In some embodiments, a thickness of the barrier layer 510 can be in a range from about 3 nm to about 20 nm.

The storage layer 520 can be formed between the tunneling layer 530 and the barrier layer 510. Electrons or holes from the channel layer can tunnel to the storage layer 520 through the tunneling layer 530. The storage layer 520 can be used for storing electronic charges (electrons or holes) for memory operation. The storage or removal of charge in the storage layer 520 can impact the on/off state and/or a conductance of the semiconductor channel. The storage layer 520 can include one or more films of materials including, but are not limited to, silicon nitride, silicon oxynitride, a combination of silicon oxide and silicon nitride, or any combination thereof. In some embodiments, the storage layer 520 can include a nitride layer formed by using one or more deposition processes. In some embodiments, a thickness of the storage layer 520 can be in a range from about 3 nm to about 20 nm.

The tunneling layer 530 can be formed on the sidewall of the storage layer 520. The tunneling layer 530 can be used for tunneling electronic charges (electrons or holes). The tunneling layer 530 can include dielectric materials including, but not limited to, silicon oxide, silicon nitride, silicon oxynitride, or any combination thereof. In some embodiments, the tunneling layer 130 can be an oxide layer formed by using a deposition process. In some embodiments, a thickness of the tunneling layer 530 can be in a range from about 3 nm to about 20 nm.

Referring back to FIG. 2, the method proceeds to operation S240, in which an enhanced channel layer can be formed to cover the functional layer in each channel hole. The enhanced channel layer can include at least two sub channel layers, and can be formed by using two or more deposition processes and an ion implantation process performed between the two or more deposition processes. In some embodiments, a merging point of the enhanced channel layer can be higher than a bottom surface of the alternating dielectric stack. A detailed fabricating process of forming the enhanced channel layer is described below.

In some embodiments, fabricating method of forming the enhanced channel layer can include forming a first channel layer to cover the functional layer in each channel hole. As shown in FIG. 4, the first channel layer 610 can cover the functional layer 500 on the sidewall of each channel hole and on the bottom of each channel hole. In some embodiments, the first channel layer 610 can be an amorphous silicon layer or a polysilicon layer formed by using a thin film deposition process, such as ALD, CVD, PVD, or any other suitable process. In some embodiments, a thickness of the first channel layer 610 on the sidewall of each channel hole 400 can be in a range from about 5 nm to 10 nm, such as about 7 nm, and a thickness of the first channel layer 610 on the bottom of each channel hole 400 can be in a range from about 10 nm to 20 nm, such as about 14 nm.

Figure 5:
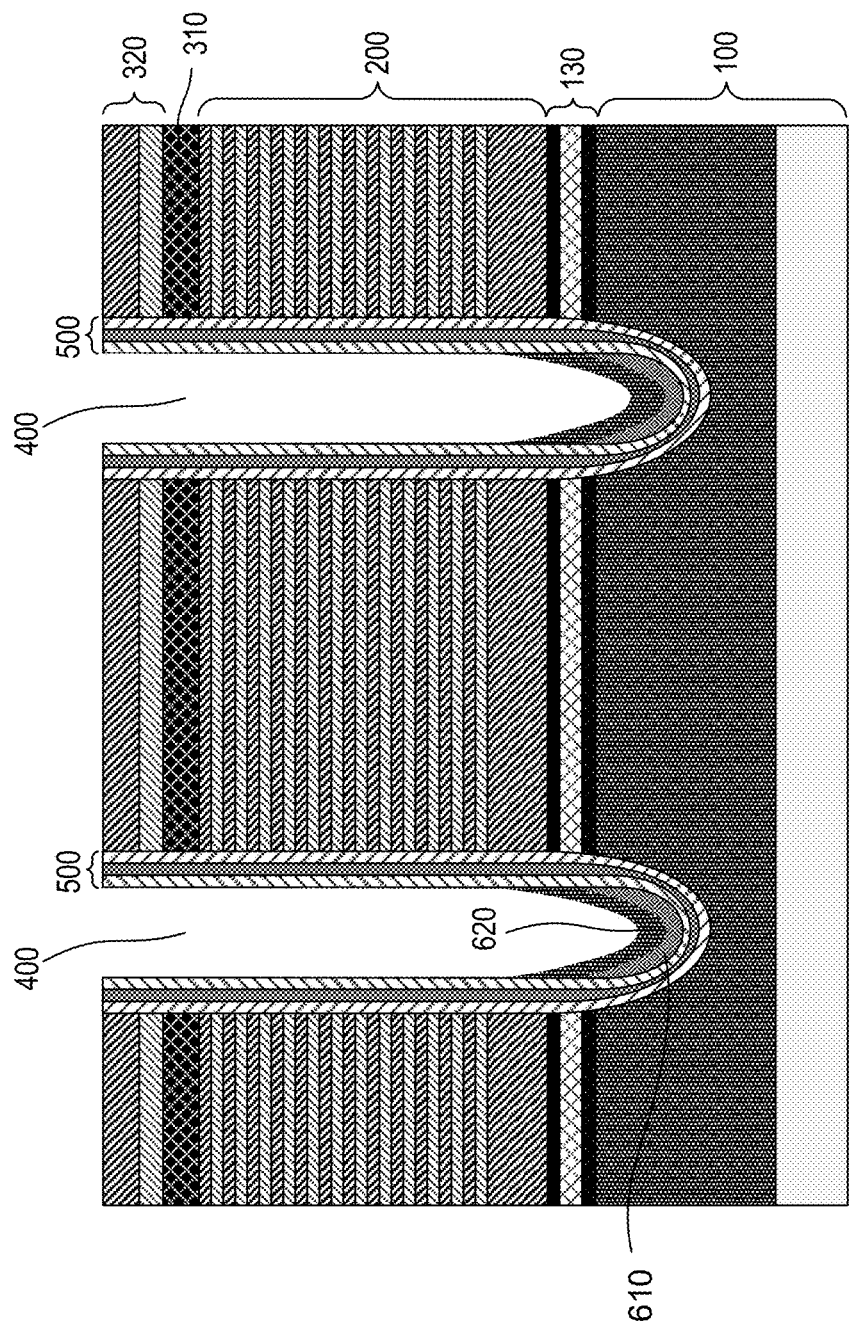

In some embodiments, fabricating method of forming the enhanced channel layer can further include performing a cleaning process to clean the multiple channel holes. The cleaning process can be a plasma ashing process including an high temperature ashing, and/or a wet stripping. For example, a plasma source can be used to generate a reactive species, such as oxygen or fluorine. The reactive species can combine with the photoresist remained in the channel holes to form ash, which can be removed with a vacuum pump. Specifically, in some embodiments, monatomic oxygen plasma can be created by exposing oxygen gas at a low pressure to high power radio waves, which ionize the oxygen gas. The residue of the reaction between the oxygen and photoresist material can generate ash in the plasma asher. The byproducts of the ashing process, such as volatile carbon oxides, water vapor can be pumped away with the vacuum pump within the plasma asher. In some embodiments, a portion or all of the first channel layer 610 on the sidewall of each channel hole 400 can be removed during the cleaning process. In some embodiments, a thickness of the first channel layer 610 on the bottom of each channel hole 400 can be reduced during the cleaning process, as shown in FIG. 5.

In some embodiments, fabricating method of forming the enhanced channel layer can further include performing an implantation (IMP) process to treat the exposed surface of the first channel layer 610 on the bottom of each channel hole 400. The IMP process can implant Boron ions to the exposed surface of the first channel layer 610 on the bottom of each channel hole 400. As such, an upper portion of the first channel layer 610 can form a doped channel layer 620, as shown in FIG. 5.

Figure 6:
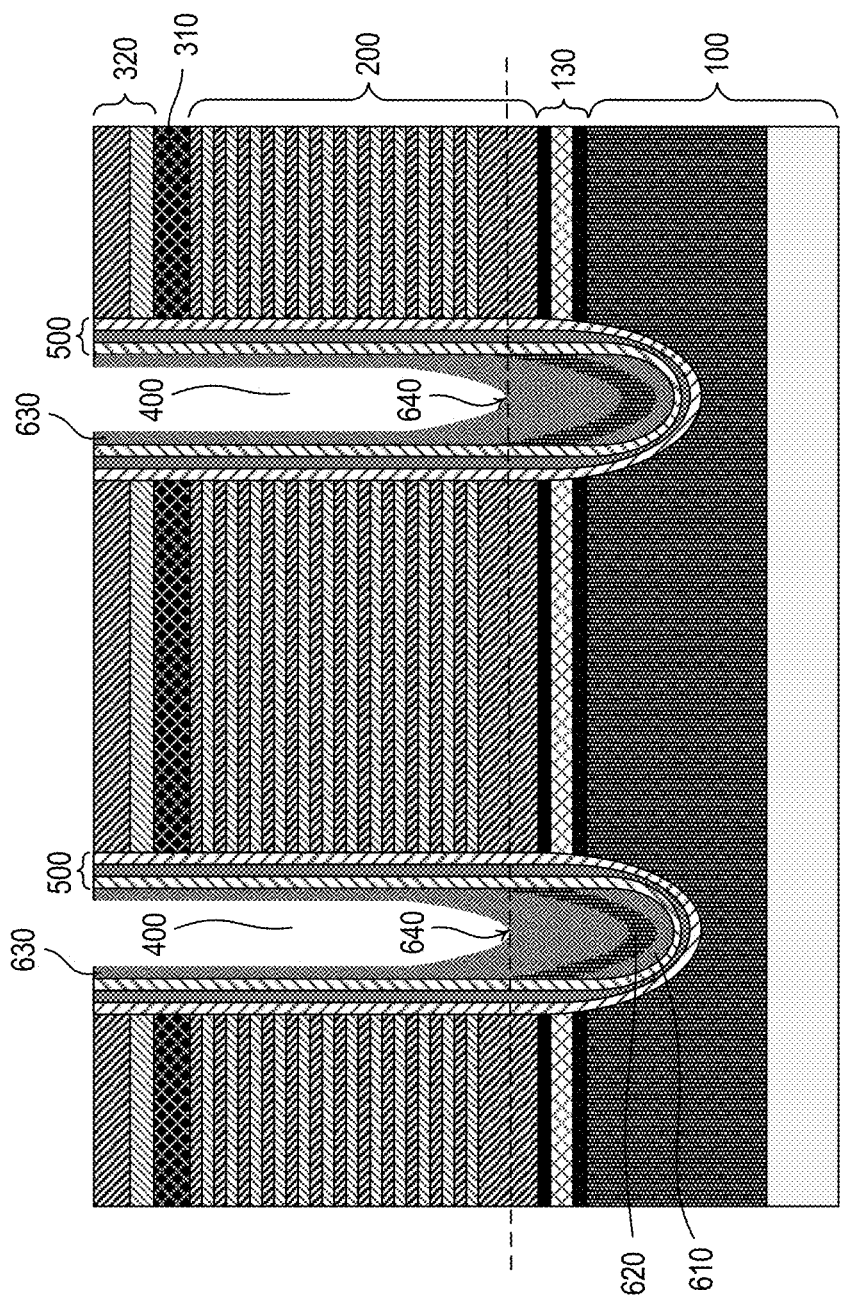

In some embodiments, fabricating method of forming the enhanced channel layer can further include forming a second channel layer to cover the functional layer and the doped channel layer in each channel hole. As shown in FIG. 6, the second channel layer 630 can cover the functional layer 500 and/or the remaining portion of the first channel layer 610 on the sidewall of each channel hole, and cover the doped channel layer 620 on the bottom of each channel hole. In some embodiments, the second channel layer 630 can be an amorphous silicon layer or a polysilicon layer formed by using a thin film deposition process, such as ALD, CVD, PVD, or any other suitable process. In some embodiments, a thickness of the second channel layer 630 on the sidewall of each channel hole 400 can be in a range from about 5 nm to 10 nm, such as about 7 nm, and a thickness of the second channel layer 630 on the bottom of each channel hole 400 can be in a range from about 10 nm to 20 nm, such as about 14 nm.

It is noted that, at the bottom of each channel hole 400, the second channel layer 630 is stacked on the first channel layer 610 and the doped channel layer 620. The formed enhanced channel layer including the first channel layer 610, the doped channel layer 620, and the second channel layer 630 at the bottom of each channel hole 400 can have an increased thickness no less than 15 nm, such as in a range from about 15 nm to 25 nm. In some embodiments, a first thickness of the enhanced channel layer at a portion in contact with the selective epitaxial growth layer is at least twice of a second thickness of the enhanced channel layer at a portion on the sidewall of the channel holes. Since the enhanced channel layer has an increased thickness at the at the bottom of each channel hole, a merging point 640 of the enhanced channel layer is higher than the bottom surface of the alternating dielectric stack 200, as shown in FIG. 6.

Figure 7:
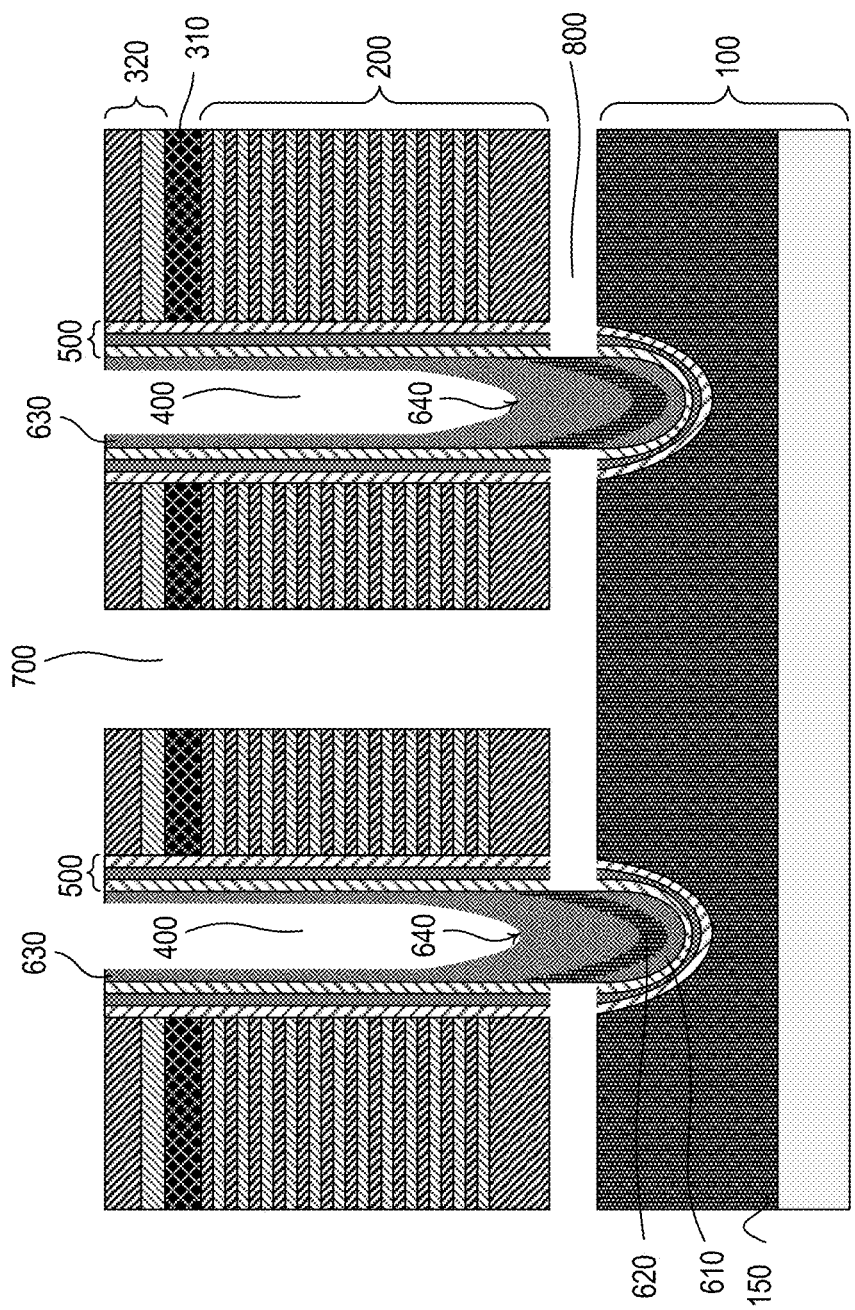

Referring back to FIG. 2, the method proceeds to operation S250, in which multiple gate line slits can be formed in the alternating dielectric stack. As shown in FIG. 7, each gate line slit 700 (only one gate line slit 700 is shown fir simplicity) can vertically penetrate through the hard mask layer 320, the insulating layer 310, the alternating dielectric stack 200, and laterally extend between two arrays of channel holes 400. The multiple gate line slits 700 can be formed by forming a mask layer over the hard mask layer 320 and patterning the mask using, e.g., photolithography, to form openings corresponding to the multiple slits in the patterned mask layer. A suitable etching process, e.g., dry etch and/or wet etch, can be performed to remove portions of the hard mask layer 320, the insulating layer 310, the alternating dielectric stack 200 exposed by the openings until the multiple gate line slits 700 expose the sacrificial layer 130 or the doped upper substrate 150. The mask layer can be removed after the formation of the multiple gate line slits 700.

Referring back to FIG. 2, the method proceeds to operation S260, in which the sacrificial layer can be removed to form a horizontal trench, and portions of the functional layer exposed by the horizontal trench can be removed to expose the enhanced channel layer.

As shown in FIG. 7, the sacrificial layer 130 can be removed by using any suitable etching process, e.g., an isotropic dry etch or a wet etch. In some embodiments, the etchant of the isotropic dry etch includes one or more of $CF_4$, $CHF_3$, $C4F_8$, $C4F_6$, and $CH_2F_2$. In some other embodiments, the etchant of the wet etch includes phosphoric acid. The etching process can have sufficiently high etching selectivity of the materials of the sacrificial layer 130 over the materials of other layers in the 3D structure, such that the etching process can have minimal impact on the other layers of the 3D structure. The isotropic dry etch and/or the wet etch can remove the sacrificial layer 130 in various directions to expose a portion of the side wall surface of the functional layer 500 in each channel hole 400. As such, the horizontal trench 800 can be formed between the alternating dielectric stack 200 and the doped upper substrate 150. As shown in FIG. 4, the horizontal trench 800 can extend in a horizontal direction, and can be used as spaces for forming bottom select gate (BSG) electrodes in the subsequent processes. It is noted that, the term "horizontal/horizontally" used herein means nominally parallel to a lateral surface of the substrate 100.

Further, as shown in FIG. 7, the portion of the functional layer 500 in each channel hole 400 exposed by the horizontal trench 800 can be removed by using any suitable etching process, e.g., an isotropic dry etch or a wet etch. In some embodiments, the etchant of the isotropic dry etch includes one or more of $CF_4$, $CHF_3$, $C4F_8$, $C4F_6$, and $CH_2F_2$. In some other embodiments, the etchant of the wet etch includes phosphoric acid. The etching process can have sufficiently high etching selectivity of the materials of the functional layer 500 over the materials of other layers in the 3D structure, such that the etching process can have minimal impact on the other layers of the 3D structure. The isotropic dry etch and/or the wet etch can remove the portion of the functional layer 500 in each channel hole 400 that is exposed by the horizontal trench 800. As such, the side wall surface of the enhanced channel layer can be exposed by the horizontal trench 800, as shown in FIG. 7.

Figure 8:
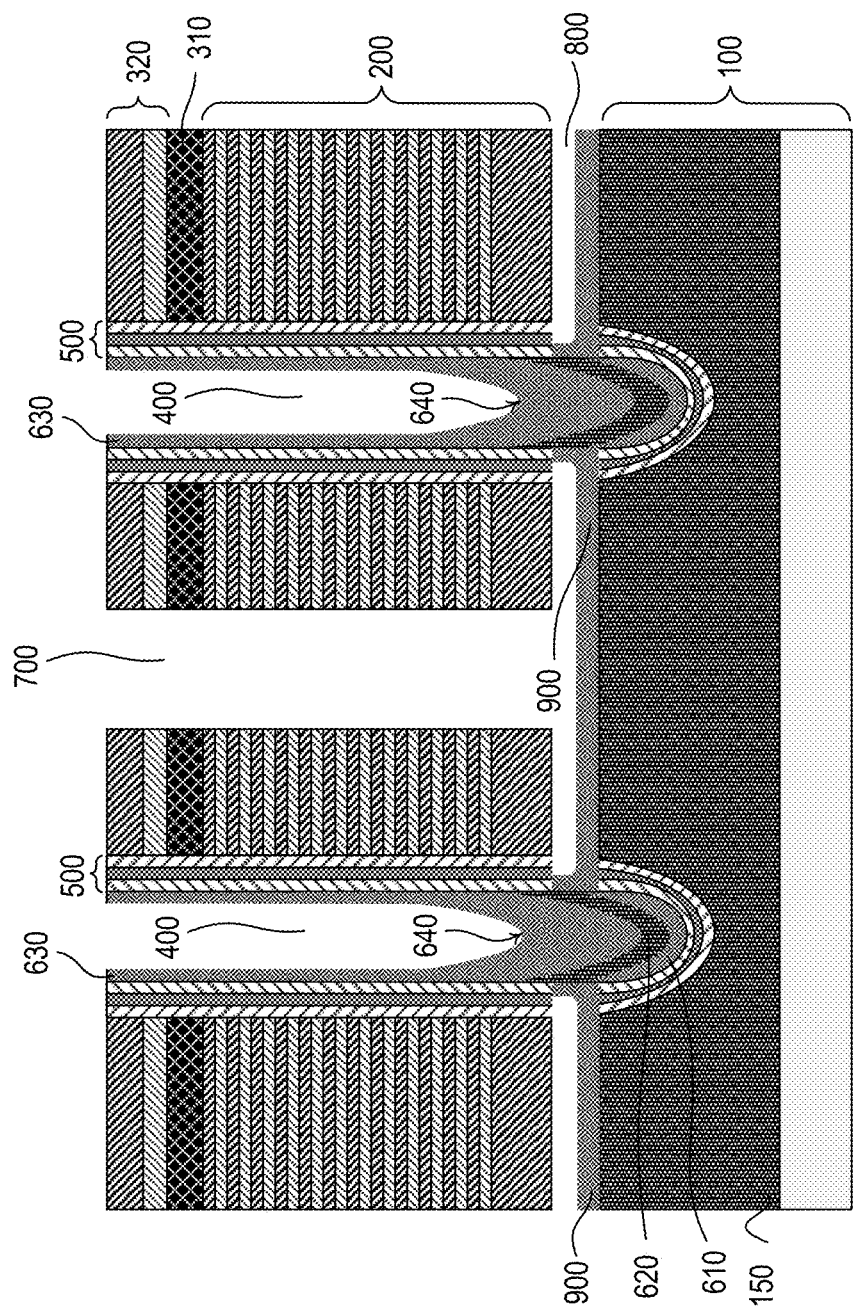
Figure 9:
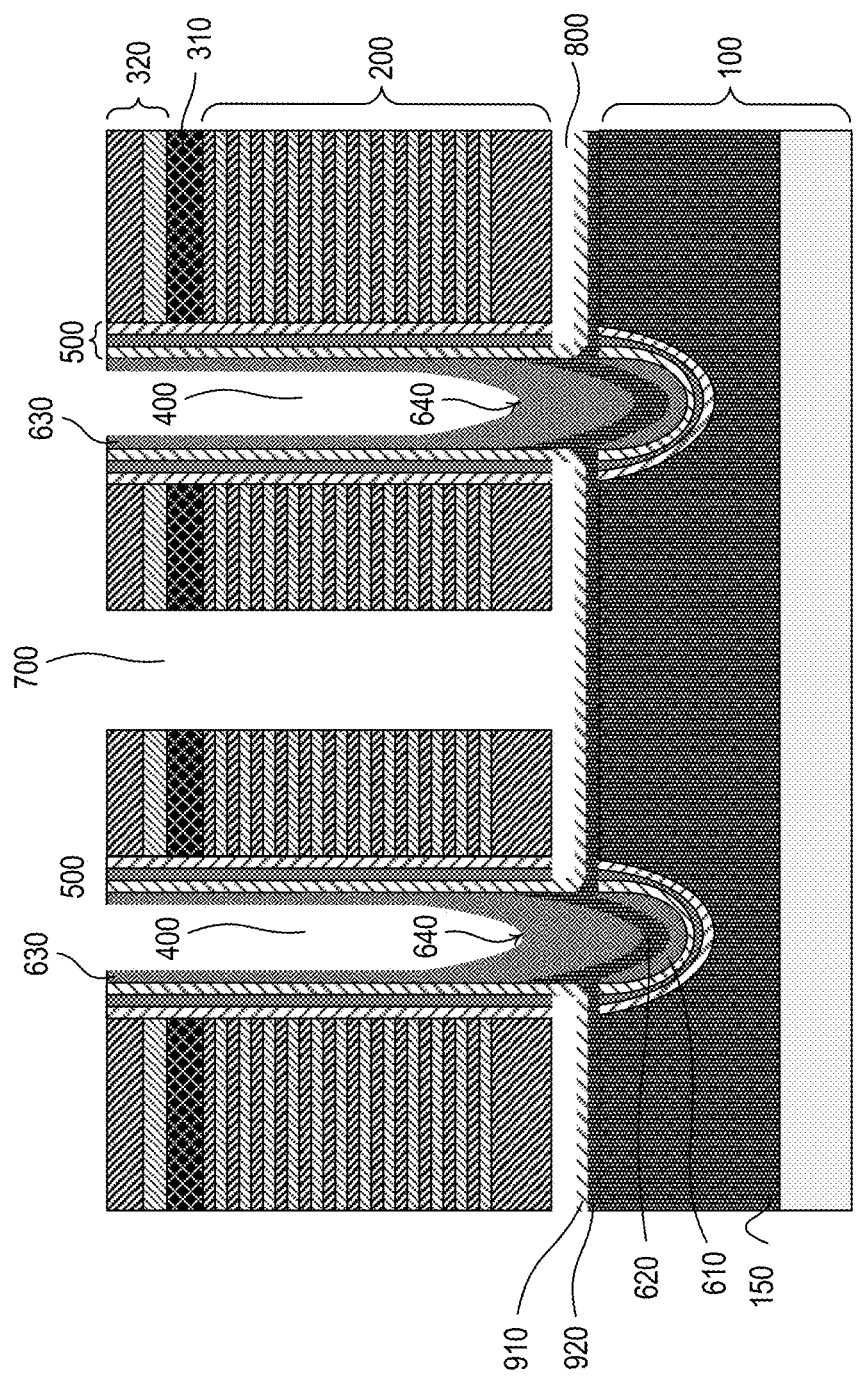

Referring back to FIG. 2, the method proceeds to operation S270, in which a selective epitaxial growth (SEG) layer can be formed in the horizontal trench. As shown in FIG. 8, the formed SEG 900 can be in contact with the upper surface of the doped upper substrate 150 and the surface of the enhanced channel layer exposed by the horizontal trench 800 in each channel hole 400. That is, a cross sectional view of the SEG layer 900 can have a rough oblate "L" shape, while the short vertical side is in contact with the surface of the enhanced channel layer while the long horizontal side is in contact with the upper surface of the doped upper substrate 150.

In some embodiments, the SEG layer 900 can be a polysilicon layer formed by using a SEG process. Optionally, an SEG pre-cleaning process can be performed to clean the horizontal trench 800. For example, a phosphoric acid rinsing process can be performed to remove the impurities on the inner wall of the horizontal trench 800. A following deposition process can be performed to form a polysilicon layer in the horizontal trench 800. In some embodiments, a thickness of the SEG layer 900 can be in a range from 30 nm to 100 nm, such as about 40 nm.

In some embodiments, the surface of the SEG layer 900 exposed by the horizontal trench 800 can be oxidized by any suitable oxidation process to form an isolation layer 910. In some embodiments, a thickness of the isolation layer 910 is in a rave from 10 nm to 20 nm, such as about 16 nm. A following annealing process can be performed to drive boron diffusion from the doped upper substrate 150 and the doped channel layer 620 in each channel hole 400. As such, the un-oxidized portion of the SEG layer 900 becomes a polysilicon layer 920 that is in contact with both the doped upper substrate 150 and the enhanced channel layer in each channel hole 400. Thus, the doped upper substrate 150 and the polysilicon layer 920 can form the bottom select gate (BSG) electrode which is electronically connected with the enhanced channel layer in each channel hole 400.

In some embodiments, the fabricating method of forming the 3D memory device as shown in FIG. 2 can further include any other suitable subsequent processes. For example, the fabricating method can further include forming a filling structure (not shown) to cover the enhanced channel layer and fill each channel hole 400. As another example, the fabricating method can further include forming a channel plug (not shown) at a top of each channel hole 400 and in contact with the enhanced channel layer. The material of the channel plug can include any suitable conductive material, such as Si, W, etc. As yet another example, the fabricating method can further include performing a gate replacement process (or referred as a word line replacement process) to replace the multiple second dielectric layer 220 to multiple conductive layers. As such, the alternating dielectric stack 200 is transformed to an alternating dielectric/conductive layer stack. As yet another example, the fabricating method can further include forming two spacer layer on the sidewalls of each gate line silt 700, and forming a conductive wall (not shown) in each gate line silt 700, the lower end of each conductive wall can be in contact with a corresponding doped region.

Accordingly, a method for forming a 3D memory device is provided in some embodiments in accordance with the present disclosure. In the disclosed method, a two-step channel layer filling process can increase the thickness of the channel layer at the region that is exposed by the horizontal trench. That is, the formed enhanced channel structure can have a higher merging point, which can effectively reduce the risk of channel layer broken during post SEG oxidation. Further, the disclosed method includes a two-side Boron doping process to from an enhanced BSG layer, which can effectively improve the control ability of the formed BSG electrodes.

Embodiments of method for forming channel structures and BSG electrodes of 3D memory devices and fabrication methods thereof are disclosed herein.

In some embodiments, a method for forming a three-dimensional (3D) NAND memory device comprises forming a sacrificial layer on a substrate, forming an alternating dielectric stack on the sacrificial layer, forming a plurality of channel holes vertically penetrating the alternating dielectric stack and the sacrificial layer, and forming a first channel layer in each channel hole. The method further comprises forming a second channel layer on the first channel layer in each channel hole, such that a merging point of the second channel layer is higher than a bottom surface of the alternating dielectric stack. The method further comprises removing the sacrificial layer to form a horizontal trench, and forming a selective epitaxial growth layer in the horizontal trench.

In some embodiments, the method further comprises, before forming the sacrificial layer, performing an implantation process to an upper surface of the substrate to form a doped upper substrate.

In some embodiments, forming the sacrificial layer comprises forming a monocrystalline silicon film sandwiched between two protect films.

In some embodiments, forming the alternating dielectric stack comprises forming at least 64 dielectric layer pairs each comprising a first dielectric layer and a second dielectric layer different from the first dielectric layer.

In some embodiments, the method further comprises, before forming the first channel layer, forming a functional layer including a barrier layer, a storage layer and a tunneling layer on a sidewall of each channel hole; and after removing the sacrificial layer, removing a portion of the functional layer that is exposed by the horizontal trench.

In some embodiments, forming the forming the first channel layer comprises:

forming the first channel layer to cover the functional layer in each channel hole; performing a cleaning process to clean the multiple channel holes; and performing an implantation process to treat an exposed surface of the first channel layer on the bottom of each channel hole to form a doped channel layer.

In some embodiments, forming the second channel layer comprises forming the second channel layer in each channel hole to cover the sidewall of the channel hole and a top surface of the doped channel layer.

In some embodiments, the method further comprises, before removing the sacrificial layer, forming a gate line slit penetrating the alternating dielectric stack to expose the sacrificial layer.

In some embodiments, forming the selective epitaxial growth layer comprises forming an "L" shaped selective epitaxial growth layer in the horizontal trench, wherein a vertical surface of the selective epitaxial growth layer is in contact with the first channel layer or the second channel layer, and a horizontal surface of the selective epitaxial growth layer is in contact with the doped upper substrate.

In some embodiments, forming the selective epitaxial growth layer further comprises oxidizing an exposed surface of the selective epitaxial growth layer, and performing an annealing process to diffuse ions from the doped upper substrate and the doped channel layer to an un-oxidized portion of the selective epitaxial growth layer.

Another aspect of the present disclosure provides a three-dimensional (3D) NAND memory device, comprising: a selective epitaxial growth layer on a substrate; an alternating dielectric/conductive stack on the selective epitaxial growth layer, the alternating dielectric/conductive stack including a plurality of dielectric/conductive layer pairs on a substrate, each of the plurality of dielectric/conductive layer pairs comprising a dielectric layer and a conductive layer; a plurality of channel holes vertically penetrating the alternating dielectric stack and the sacrificial layer; and an enhanced channel layer including at least two sub channel layers in each channel hole, wherein a merging point of the enhanced channel layer is higher than a bottom surface of the alternating dielectric/conductive stack.

In some embodiments, the substrate includes a doped upper substrate; and the selective epitaxial growth layer is located on the doped upper substrate.

In some embodiments, the device further comprises a horizontal trench between the selective epitaxial growth layer and the alternating dielectric/conductive stack.

In some embodiments, a surface of the selective epitaxial growth layer exposed by the horizontal trench is oxidized.

In some embodiments, the selective epitaxial growth layer has an "L" shape, wherein a vertical surface of the selective epitaxial growth layer is in contact with the enhanced channel layer, and a horizontal surface of the selective epitaxial growth layer is in contact with the doped upper substrate.

In some embodiments, the alternating dielectric/conductive stack comprises at least 64 dielectric layer pairs each comprising a dielectric layer and a conductive layer.

In some embodiments, the device further comprises a functional layer including a barrier layer, a storage layer and a tunneling layer on a sidewall of each channel hole and covered by the enhanced channel layer; and at least one gate line slit vertically penetrating the alternating dielectric/conductive stack and horizontally extending between the plurality of channel holes.

In some embodiments, a first thickness of the enhanced channel layer at a portion in contact with the selective epitaxial growth layer is at least twice of a second thickness of the enhanced channel layer at a portion on the sidewall of the channel holes.

In some embodiments, an inner portion of the enhanced channel layer is doped with Boron ions.

In some embodiments, an un-oxidized portion of the selective epitaxial growth layer includes Boron ions diffused from the inner portion of the enhanced channel layer and the doped upper substrate.

Other aspects of the present disclosure can be understood by those skilled in the art in light of the description, the claims, and the drawings of the present disclosure.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) NAND memory device, comprising:
   treating, by performing an ion implantation process, an upper portion of a substrate to form a doped upper substrate;
   forming a sacrificial layer on the doped upper substrate;
   forming an alternating dielectric stack on the sacrificial layer;
   forming a plurality of channel holes vertically penetrating the alternating dielectric stack and the sacrificial layer;
   forming a first channel layer in each channel hole;
   forming a second channel layer in each channel hole to cover a side surface of the first channel layer;
   removing the sacrificial layer to form a horizontal trench; and
   forming a selective epitaxial growth layer in the horizontal trench.

2. The method of claim 1, wherein forming the sacrificial layer comprises forming a monocrystalline silicon film sandwiched between two protect films.

3. The method of claim 1, wherein forming the alternating dielectric stack comprises:
   forming at least 64 dielectric layer pairs each comprising a first dielectric layer and a second dielectric layer different from the first dielectric layer.

4. The method of claim 1, further comprising:
   before forming the first channel layer, forming a functional layer including a barrier layer, a storage layer and a tunneling layer on a sidewall of each channel hole; and
   after removing the sacrificial layer, removing a portion of the functional layer that is exposed by the horizontal trench.

5. The method of claim 4, wherein forming the first channel layer comprises:
   forming the first channel layer to cover the functional layer in each channel hole;
   performing a cleaning process to clean the multiple channel holes; and
   performing an implantation process to treat an exposed surface of the first channel layer on the bottom of each channel hole to form a doped channel layer.

6. The method of claim 5, wherein forming the second channel layer comprises:
   forming the second channel layer in each channel hole to cover the sidewall of the channel hole and a top surface of the doped channel layer.

7. The method of claim 1, further comprising:
   before removing the sacrificial layer, forming a gate line slit penetrating the alternating dielectric stack to expose the sacrificial layer.

8. The method of claim 5, wherein forming the selective epitaxial growth layer comprises:
   forming an "L" shaped selective epitaxial growth layer in the horizontal trench, wherein a vertical surface of the selective epitaxial growth layer is in contact with the first channel layer or the second channel layer, and a horizontal surface of the selective epitaxial growth layer is in contact with the doped upper substrate.

9. The method of claim 5, wherein forming the selective epitaxial growth layer further comprises:
   oxidizing an exposed surface of the selective epitaxial growth layer; and
   performing an annealing process to diffuse ions from the doped upper substrate and the doped channel layer to an un-oxidized portion of the selective epitaxial growth layer.

10. The method of claim 1, wherein forming the second channel layer comprises increasing a thickness of the second channel layer such that a merging point of an inner surface of the second channel layer is higher than a bottom surface of the alternating dielectric stack.

11. The method of claim 1, wherein a first thickness of a first portion of the second channel layer in contact with the first channel layer is formed to be at least twice a second thickness of a second portion of the second channel layer on a sidewall of each channel hole.

12. The method of claim 1, wherein:
    the alternating dielectric stack is formed with a bottom layer on the sacrificial layer; and
    a merging point of an inner surface of the second channel layer is formed lower than a top surface of the bottom layer.

13. The method of claim 1, wherein forming the alternating dielectric stack comprises alternatingly forming first and second dielectric layers stacking with each other, wherein the first dielectric layers comprises a bottom layer in contact with the sacrificial layer, and wherein a thickness of the bottom layer is formed to be greater than a thickness of any other first and second dielectric layers.

14. The method of claim 13, further comprising replacing the second dielectric layers with a plurality of conductive layers.

15. The method of claim 6, wherein a merging point of an inner surface of the second channel layer and a top point of the doped channel layer are formed at a substantially same height.

16. The method of claim 1, wherein forming the second channel layer comprises depositing an amorphous silicon layer or a polysilicon layer on the first channel layer.

17. A method for forming a three-dimensional (3D) NAND memory device, comprising:
    forming a sacrificial layer on a substrate;

forming an alternating dielectric stack on the sacrificial layer;

forming a plurality of channel holes vertically penetrating the alternating dielectric stack and the sacrificial layer;

forming a functional layer on a sidewall of each of the plurality of channel holes;

forming a first channel layer to cover the functional layer in each of the plurality of channel holes;

performing a cleaning process to clean the plurality of channel holes;

performing an implantation process to treat an exposed surface of the first channel layer on the bottom of each of the plurality of channel holes;

forming a second channel layer on the exposed surface of the first channel layer in each of the plurality of channel holes;

removing the sacrificial layer to form a horizontal trench; and forming a selective epitaxial growth layer in the horizontal trench.

18. A method for forming a three-dimensional (3D) NAND memory device, comprising:

forming a sacrificial layer on a substrate, comprising forming a monocrystalline silicon film sandwiched between two protect films;

forming an alternating dielectric stack on the sacrificial layer;

forming a plurality of channel holes so as to vertically penetrate the alternating dielectric stack and the sacrificial layer;

forming a first channel layer in each channel hole;

forming a second channel layer in each channel hole to cover a side surface of the first channel layer;

removing the sacrificial layer to form a horizontal trench; and forming a selective epitaxial growth layer in the horizontal trench.

19. The method of claim 18, wherein forming the first channel layer comprises performing an implantation process to treat an exposed surface of the first channel layer to form a doped channel layer.

20. The method of claim 19, wherein removing the sacrificial layer comprises exposing the doped channel layer in the horizontal trench.

* * * * *